US007102795B1

(12) United States Patent
Lübcke

(10) Patent No.: US 7,102,795 B1
(45) Date of Patent: Sep. 5, 2006

(54) METHOD FOR ENGRAVING PRINTING CYLINDERS

(75) Inventor: Bernd Lübcke, Molfsee (DE)

(73) Assignee: Hell Gravure Systems GmbH, Kiel (DE)

( * ) Notice: Subject to any disclaimer, the term of this patent is extended or adjusted under 35 U.S.C. 154(b) by 1010 days.

(21) Appl. No.: 10/110,648

(22) PCT Filed: Oct. 27, 2000

(86) PCT No.: PCT/DE00/03792

§ 371 (c)(1),
(2), (4) Date: Jul. 23, 2002

(87) PCT Pub. No.: WO01/32421

PCT Pub. Date: May 10, 2001

(30) Foreign Application Priority Data

Nov. 4, 1999 (DE) ................................ 199 52 994

(51) Int. Cl.
*B41C 1/04* (2006.01)
*G06F 19/00* (2006.01)
*G01D 21/00* (2006.01)
*G01R 23/02* (2006.01)

(52) U.S. Cl. ....................... 358/3.29; 700/175; 702/35; 73/659

(58) Field of Classification Search ...... 358/3.29–3.32, 358/504, 406; 702/34–35; 700/174–175, 700/177; 73/658–660, 104; 324/623; 382/152
See application file for complete search history.

(56) References Cited

U.S. PATENT DOCUMENTS 4,087,801 A * 5/1978 Noh ............................ 73/104
4,413,507 A * 11/1983 Drew et al. .................... 73/104
5,416,597 A 5/1995 Mubaslat
5,737,091 A 4/1998 Holowko et al.
6,556,925 B1 * 4/2003 Mori et al. ................... 702/34

FOREIGN PATENT DOCUMENTS

| | | |
|---|---|---|
| DE | 23 36 089 | 2/1975 |
| DE | 25 08 734 | 8/1976 |
| DE | 197 22 996 | 3/1998 |
| DE | 197 23 002 | 3/1998 |
| DE | 198 05 197 | 8/1999 |
| WO | WO 99/51438 | 10/1999 |

* cited by examiner

*Primary Examiner*—Scott A. Rogers
(74) *Attorney, Agent, or Firm*—Schiff Hardin LLP

(57) ABSTRACT

In a method and apparatus for engraving printing cylinders in an electronic engraving machine, an engraving control signal is formed from an image signal that represents tonal values of cups to be engraved and from a periodic raster signal for generating a printing raster. An engraving stylus of an engraving element controlled by the engraving control signal engraves a printing form in the form of cups arranged in the printing raster in a rotating printing cylinder. For checking of the functionability of the engraving stylus, test cups are engraved simultaneously when engraving the printing form. A respective measurement interval is defined for selected test cups. The raster signal is respectively eliminated from the engraving control signal for the duration of the measurement interval, and the remaining engraving control signal is investigated for harmonics characteristic of damage to the engraving stylus. A control signal signalling damage to the engraving stylus is generated given the presence of the characteristic harmonics.

21 Claims, 3 Drawing Sheets

METHOD FOR ENGRAVING PRINTING CYLINDERS

BACKGROUND OF THE INVENTION

The invention is in the field of electronic reproduction technology and is directed to a method for engraving printing cylinders in an electronic engraving machine, to an engraving stylus monitoring device for an electronic engraving machine, and is also directed to an electronic engraving machine having such an engraving stylus monitoring device.

DE-C-2508734 already discloses an electronic engraving machine for engraving printing cylinders with an engraving element. The engraving element having an engraving stylus controlled by an engraving control signal as a cutting tool moves in an axial direction along a rotating printing cylinder. The engraving stylus cuts a sequence of cups arranged in a printing raster into the generated surface cylinder. The engraving control signal is formed by a superimposition of a periodic raster signal for generating the printing raster with image signal values that define the tonal values to be reproduced between "black" and "white". Whereas the raster signal effects an oscillating lifting motion of the engraving stylus for engraving the cups arranged in the printing raster, the image signal values determine the cut depths of the engraved cups corresponding to the tonal values to be reproduced.

DE-A-23 36 089 discloses an engraving element that essentially comprises a rotatory system and an electromagnetic drive for the rotatory system. The rotatory system comprises a shaft, an armature, a bearing for the shaft, a restoring element and a damping mechanism. A lever-shaped stylus holder is attached to the shaft, this carrying the engraving stylus. The electromagnetic drive for the rotatory system comprises an excitation coil charged with the engraving control signal and a stationary electromagnet in whose air gap the armature of the rotatory system moves. The drive effects a rotatory motion of the shaft oscillating by small angles, and the stylus holder together with the engraving stylus implements a corresponding, oscillating lifting motion in the direction of the generated surface of the printing cylinder for engraving the cups.

In practice, it occasionally occurs that the engraving stylus is damaged during the engraving of a printing cylinder, for example due to wear or due to mechanical overloading, or even break offs. In this case, the partially engraved printing cylinder is unuseable as a printing form and a new printing cylinder must be engraved. Damage to or breakage of the engraving stylus thus disadvantageously causes a loss of time in printing form manufacture that, in particular, can be substantial when engraving printing cylinders for packaging printing or decorative printing since the engraving of such printing cylinders can last several hours.

WO-A-9951438 already discloses an engraving machine for engraving printing cylinders wherein the actual dimensions of cups engraved on the printing cylinder are determined for recognizing damage to the engraving stylus, and error values are determined by comparing the actual dimensions to rated dimensions and wherein a signal for aborting the engraving is generated when the identified error values respectively exceed a prescribed limit value of tolerance range

SUMMARY OF THE INVENTION

It is an object of the invention to specify a method for engraving printing cylinders in an electronic engraving machine, an engraving stylus monitoring device for an electronic engraving machine, as well as an electronic engraving machine having such an engraving stylus monitoring device with which the time loss in manufactured printing forms that arises in case of damage to an engraving stylus during engraving is advantageously reduced.

According to the invention for engraving printing cylinders in an electronic engraving machine, an engraving control signal is formed from an image signal that represents tonal values of cups to be engraved and from a periodic raster signal for generating a printing raster. An engraving stylus of an engraving element controlled by the engraving control signal engraves a printing form engraving line by engraving line in the form of cups arranged in the printing raster in a rotating printing cylinder. For checking of functionability of the engraving stylus, test cups are engraved in prescribed printing cylinder regions when engraving the printing form. A respective measurement interval is defined for selected test cups. The raster signal is respectively eliminated from the engraving control signal for a duration of the measurement interval. The remaining control signal is respectively investigated within the measurement interval for harmonics characteristic of damage to the engraving stylus. A control signal signaling damage to the engraving stylus is generated given presence of the characteristic harmonics.

DESCRIPTION OF THE PREFERRED EMBODIMENTS

Figure 1:
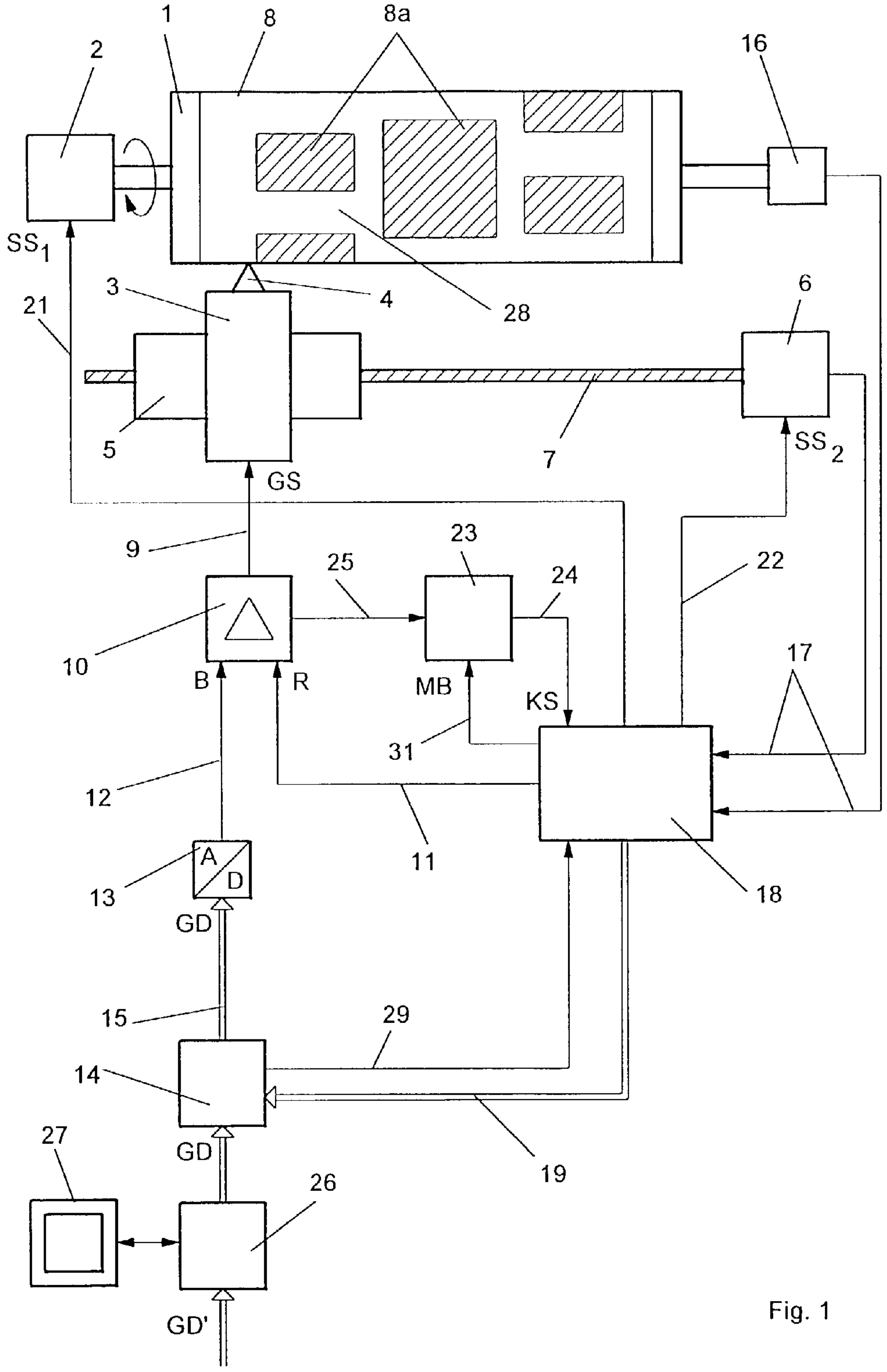
FIG. 1 is a block circuit diagram of an electronic engraving machine having an engraving stylus monitoring device.

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

FIG. 1 shows a block circuit diagram of an electronic engraving machine that, for example, is a Helioklischograph® of Hell Gravure Systems GmbH, Kiel, Del.

A printing cylinder 1 is driven by a rotational drive 2. An engraving element 3 having an engraving stylus 4 as a cutting tool is mounted on an engraving carriage 5 that is movable in an axial direction of the rotating printing cylinder 1 the assistance of a spindle 7 driven by a feed drive 6. The engraving element 3, for example, is equipped with an electromagnetic drive for the engraving stylus 4. The engraving stylus 4 can also be driven by a solid state actuator element comprising a piezoelectric or magnetorestrictive material.

The engraving element 3 engraves a printing form 8 comprised of individual engraving elements 8_a_, referred to below as copies. When engraving the printing form 8, an engraving stylus 4 controlled by an engraving control signal (GS) cuts a sequence of cups arranged in a printing raster into the generated surface of the printing cylinder 1 engraving line by engraving line while the engraving carriage 5 with the engraving element 3 moves along the rotating printing cylinder 1 in the axial direction step-by-step or continuously for planar engraving.

The engraving control signal GS on a line 9 is generated in an engraving amplifier 10 by superimposition of a periodic raster signal (R) on a line signal 11 with an image signal (B) on a line 12 that represents the tonal values between "light" and "dark" of the cups to be engraved. Whereas the raster signal R effects an oscillating lifting motion of the engraving stylus 4 for engraving the cups arranged in the printing raster, the image signal values B determine the cut depths of the cups corresponding to the tonal values to be reproduced. The image signal B is acquired in a D/A converter 13 from engraving data GD of the printing form 8 to be engraved. The engraving data GD are deposited in an engraving data memory 14 from which they are read out engraving line by engraving line and supplied to the D/A converter 13 via a data bus 15.

The engraving locations of the cups on the printing cylinder 1 prescribed by the printing raster are defined by the location coordinates (x, y) of a coordinate system allocated to the generated surface of the printing cylinder 1 whose X-axis is aligned in the axial direction and whose Y-axis is aligned in the circumferential direction of the printing cylinder 1. The feed drive 6 generates the x-location coordinates and a pulse generator 16 mechanically coupled to the printing cylinder 1 generates the y-location coordinates. The xy-location coordinates are supplied via lines 17 to an engraving controller 18. The engraving controller 18 generates the raster signal R on a line 11, read addresses for the engraving data memory 14 on an address bus 19, as well as signals for the control and synchronization of the engraving sequence, for example a control signal $SS_1$ for the rotational drive 2 on a line 20 and a control signals $SS_2$ for the feed drive 6 on a line 21.

A cylinder layout defines the desired positions of the individual copies 8*a* of the printing form. For example, the cylinder layout is designed offline by an operator in a workstation 26 by means of manually positioning the individual copies 8*a* with a cursor or by inputting position coordinates under visual control at a monitor 27. After the design, the engraving data (GD) of the printing form are compiled by engraving lines from the engraving data (GD') of the individual copies 8*a* on the basis of the cylinder layout that has been produced. For example, the workstation HelioCom™ of Hell Gravure Systems GmbH, Kiel, Del. can be employed as the workstation 26.

The engraving machine comprises an engraving stylus monitoring device 23 wherein the functionability of the engraving stylus 4 of the engraving element 3 is continuously checked during engraving on the basis of the engraving control signal GS of test cups simultaneously engraved with the printing form 8, and, in case of damage to the engraving stylus 4, particularly in case of stylus breakage, a control signal KS is generated. The checking of the functionability of the engraving stylus 4 occurs by an examination of harmonics in the engraving control signal GS that are characteristic of damage to the engraving stylus 4.

The engraving control signal (GS) is supplied to the engraving stylus monitoring device 23 from the engraving amplifier 10 via a line 25. The control signal KS that proceeds to the engraving controller 18 via a line 24 switches off the rotatory drive 2 and the feed drive 6 with the control signals $SS_1$ and $SS_2$ on the lines 20, 21 for the purpose of aborting the engraving in case of a stylus breakage. Simultaneously or alternatively, the stylus breakage can be acoustically or optically signaled with the assistance of the control signal KS.

For continuously checking the functionability of the engraving stylus 4, test cups in prescribed printing cylinder regions 28 are simultaneously engraved when engraving the printing form 8.

The interspaces remaining between the engraving elements 8*a* of the printing form 8 are suitable as printing cylinder regions 28 for engraving the test cups. Advantageously, the suitable printing cylinder regions 28 can be marked in the cylinder layout, and the engraving data GD* required for engraving the test cups can be generated when generating the engraving data GD of the printing form 8 in the work station 26 and can be deposited in the engraving data memory 14.

Deep cups corresponding to the "dark' tonal value are preferably engraved as test cups since the mechanical stressing of the engraving stylus 4 is greatest then. The engraving of the test cups can occur on every engraving line or on selected engraving lines within the cylinder regions 28. At least one cup, preferably a plurality of cups, is engraved on an engraving line, whereby the most recently engraved test cup is respectively utilized for the analysis.

For engraving the test cups, the corresponding engraving data GD* are read out from the engraving data memory 14 by engraving lines at the times at which the cylinder regions 28 just lie under the engraving element 3. The engraving of the test cups in each engraving line is signaled to the engraving controlled 18 from the engraving data memory 14 via a control line 29.

A period of the raster signal (R) is allocated to each cup and test cup to be engraved. A measurement interval 30 within the allocated period of the raster signal R is defined in the engraving controller 180 for the respectively last test cup of an engraving line. The measurement interval 30 expediently respectively lies in the time interval at the end of the allocated period of the raster signal R wherein the engraving stylus 4 settles down after the engraving of the last test cup.

In the engraving controller 18, the raster signal (R) generated therein is respectively shut off for the duration of the measurement interval 30, so that the raster signal (R) is eliminated from the engraving control signal GS for the duration of the measurement interval 30. By eliminating the raster signal R from the engraving control signal GS, the useful/noise ratio in the engraving control signal GS is diminished, as a result whereof the investigation of the harmonics is advantageously improved.

At the same time, the engraving controller 18 sends a measurement instruction MB via a control line 31 to the engraving stylus monitoring device 23 in which the engraving control signal GS is investigated over the duration of the measurement interval 30 for harmonics characteristic of damage to the engraving stylus 4 and in which the control signal KS is generated given the presence of the characteristic harmonics.

Due to the signaling of a stylus breakage, the engraving of a new printing cylinder 1 can be begun immediately for the purpose of saving time. As a result of the engraving abort given a stylus breakage, moreover, damage to the engraving element 3 or to the engraving machine itself is prevented, particularly given an automatic engraving execution.

Figure 2:
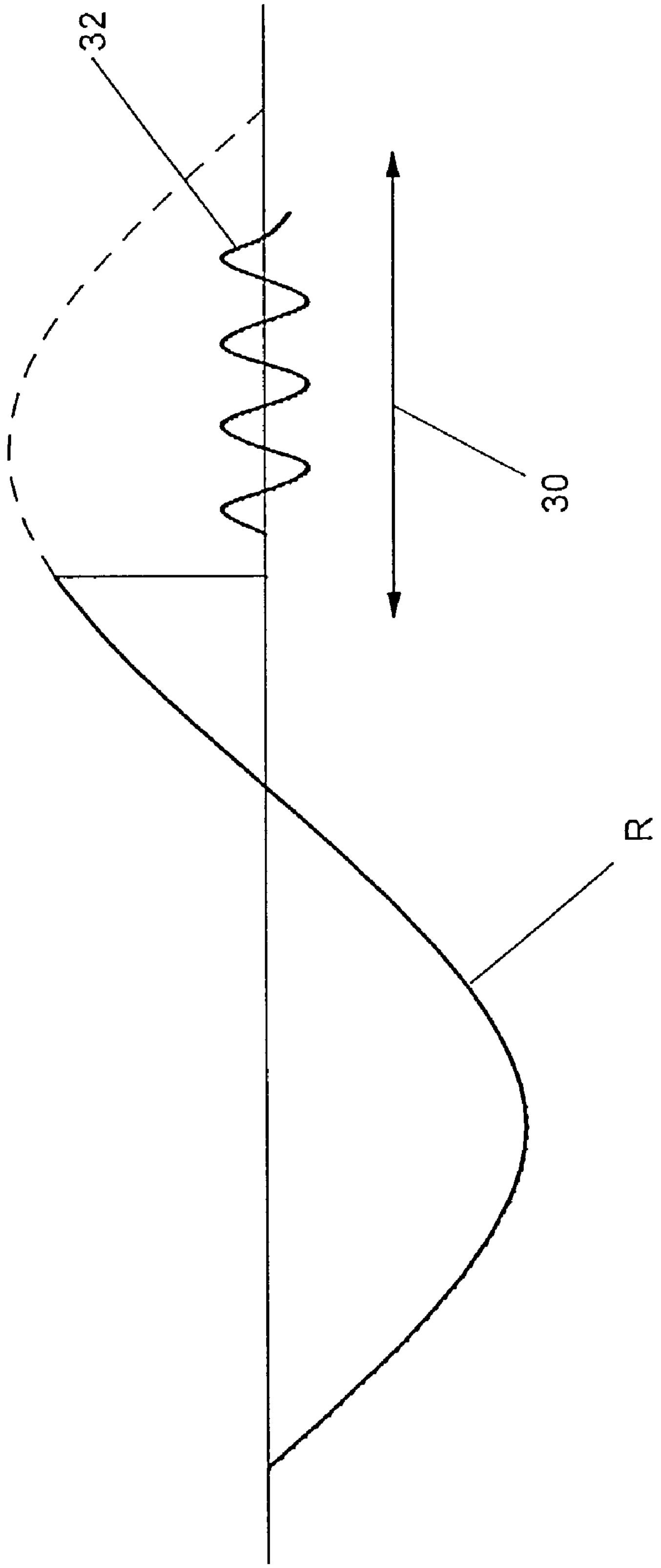
FIG. 2 shows a graphic presentation.

FIG. 2 shows a graphic illustration of a period of the raster signal R, a measurement interval 30 at the end of the period, and the suppression of the raster signal R within the measurement interval. The harmonics 32 to be analyzed are indicated at the same time.

Figure 3:
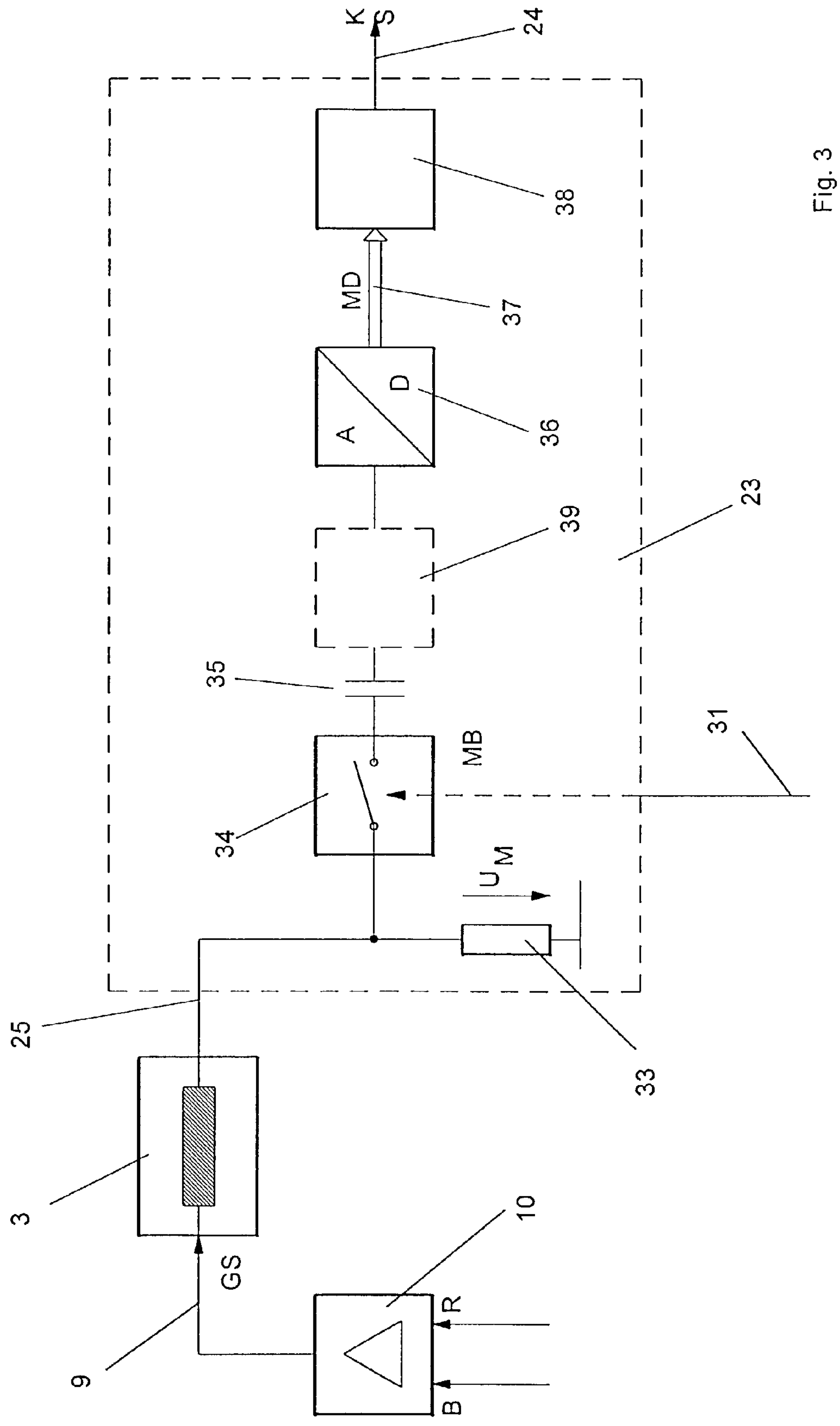
FIG. 3 shows a schematic exemplary embodiment.

FIG. 3 shows a schematic exemplary embodiment of the engraving stylus monitoring device 23. Given a current feed of the engraving element 3, the engraving control current $I_{GS}$ supplied via the line 25 is converted into a test voltage $U_M$ at a precision resistor 33 that is supplied to a switch unit 34. Controlled by the measurement instruction MB on the line 31, the test voltage $U_M$ is respectively forwarded only during the measurement interval 30. The test voltage $U_M$ proceeds via a capacitor 35 for separating the alternating voltage part out to an A/D converter 36 and is converted thereat into measured data MD. The measured data MD are supplied via a measured data bus 37 to a signal processor 38 that can be preferably designed as a digital signal processor (DSP), for example of the type TMS 320C31 of Texas Instruments.

In the signal processor 38, the measured data MD are continuously investigated for superimposed harmonics and, for example with a fast Fourier transformation (FFT), the frequency spectrum of the harmonics is identified. The identified frequency spectra are compared to a previously produced and stored frequency spectrum that is characteristic of an undamaged engraving stylus 4. Given non-coincidence of the frequency spectra, there is damage to the engraving stylus 4, and the control signal KS on the line 24 is generated. Alternatively, the identified frequency spectra can also be compared to a frequency spectrum characteristic of a damaged engraving stylus 4, whereby the correction signal KS is generated in this case given coincidence of the frequency spectra.

Such Fourier transformations known and, for example, described in Rabbiner, L. R, "Theory And Application Of Digital Signal Processing", Chapter 6, 1975, ISBN 0-13-914101-4.

For improving the harmonics analysis, the relationship of payload signal to noise signal is advantageously reduced in that the harmonics 32 to be analyzed are filtered out of the test voltage $U_M$ with a suitable filter 39, whereby the filtering occurs dependent on the frequency of the raster signal R.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

The invention claimed is:

1. A method for engraving printing cylinders in an electronic engraving machine, comprising the steps of:

forming an engraving control signal from an image signal that represents tonal values of cups to be engraved and from a periodic raster signal for generating a printing raster, with an engraving stylus of an engraving element controlled by the engraving control signal engraving a printing form engraving line by engraving line in the form of cups arranged in the printing raster in a rotating printing cylinder engraving;

for continuous checking of functionability of the engraving stylus, engraving test cups in prescribed printing cylinder regions substantially simultaneously when engraving the printing form;

defining a respective measurement interval for selected test cups within the periods of the raster signal allocated to the selected test cups;

eliminating the raster signal from the engraving control signal for a duration of the measurement interval;

respectively investigating a remaining engraving control signal within the measurement interval for harmonics characteristic of damage to the engraving stylus; and generating a control signal signalling damage to the engraving stylus given presence of the characteristic harmonics.

2. The method according to claim 1 wherein the damage comprises breakage of the engraving stylus.

3. The method according to claim 1 wherein the printing form comprises individual engraving elements; and interspaces remaining between the engraving elements are employed as cylinder regions for engraving the test cups.

4. The method according to claim 1 wherein positions of the engraving elements in the printing form are defined by a cylinder layout; and the cylinder regions for engraving the test cups are defined in the cylinder layout simultaneously with design of the cylinder layout for the printing form.

5. The method according to claim 1 wherein at least one test cup per engraving line is engraved within the defined cylinder region;

a last test cup of an engraving line is respectively selected; and the engraving control signal is respectively investigated for existing harmonics within the measurement interval of the period of the raster signal allocated to the last test cup.

6. The method according to claim 1 wherein deep cups representing "dark" tonal value are engraved as test cups.

7. The method according to claim 1 wherein the measurement interval respectively lies at an end of the period of the raster signal allocated to the selected test cup.

8. The method according to claim 1 wherein the engraving control signal for the engraving stylus is acquired from engraving data;

the engraving data of the printing form to be engraved are compiled from the engraving data of the individual engraving elements according to the cylinder layout; and the engraving data required for engraving the test cups are generated upon compilation of the engraving data for the printing form, taking the cylinder regions defined in the cylinder layout into consideration.

9. The method according to claim 1 wherein damage that has been found to the engraving stylus is at least one of acoustically and optically signaled by the control signal.

10. The method according to claim 1 wherein the engraving of the printing cylinder is aborted with the control signal when damage to the engraving stylus is found.

11. The method according to claim 1 wherein the investigation of the harmonics of the engraving control signal occurs by a digital filtering.

12. The method according to claim 11 wherein the frequency spectrum of the harmonics in the engraving control signal determined by the digital filtering is respectively compared to a frequency spectrum characteristic of an undamaged engraving stylus; and the control signal is generated given deviation of the frequency spectrum.

13. The method according to claim 1 wherein the harmonics to be investigated are filtered out of the engraving control signal for reducing a ratio of useful signal to noise signal.

14. The method according to claim 13 wherein the filtering occurs dependent on a frequency of the raster signal.

15. A method for engraving printing cylinders in an electronic engraving machine, comprising the steps of:

forming an engraving control signal from an image signal that represents tonal values of cups to be engraved and from a periodic raster signal for generating a printing raster, with an engraving stylus of an engraving element controlled by the engraving control signal engraving a printing form engraving line by engraving line in the form of cups arranged in the printing raster in a rotating printing cylinder engraving;

for checking of functionability of the engraving stylus, engraving test cups in prescribed printing cylinder regions when engraving the printing form;

defining a respective measurement interval for selected test cups within the raster signal allocated to the selected test cups;

eliminating the raster signal from the engraving control signal for a duration of the measurement interval;

respectively investigating a remaining engraving control signal within the measurement interval for harmonics characteristic of damage to the engraving stylus; and generating a control signal signalling damage to the engraving stylus given presence of the characteristic harmonics.

16. An engraving stylus monitoring device for an electronic engraving machine for engraving printing forms on a printing cylinder having an engraving stylus controlled by an engraving control signal formed of an image signal representing tonal values of cups to be engraved and of a periodic raster signal for generating a printing raster, wherein said engraving stylus monitoring device:

continuously checks a functionability of the engraving stylus, which receives an engraving control signal of test cups engraved substantially simultaneously with the printing form, and which defines for selected test cups a respective measurement interval within the periods of the raster signal allocated to the selected test cups;

eliminates the raster signal from the engraving control signal for a duration of the measurement interval;

digitally filters for respectively investigating the remaining engraving control signal within the measurement interval for a frequency spectrum characteristic of an undamaged engraving stylus; and generates a control signal signaling identified damage to the engraving stylus given deviation of the frequency spectrum.

17. The device according to claim 16 wherein the damage comprises breakage of the engraving stylus.

18. An engraving stylus monitoring device for an electronic engraving machine for engraving printing forms on a printing cylinder having an engraving stylus controlled by an engraving control signal formed of an image signal representing tonal values of cups to be engraved and of a periodic raster signal for generating a printing raster, wherein said engraving stylus monitoring device:

checks functionability of the engraving stylus, which receives an engraving control signal of test cups engraved substantially simultaneously with the printing form, which defines for selected test cups a respective measurement interval;

eliminates the raster signal from the engraving control signal for a duration of the measurement interval;

filters for respectively investigating the remaining engraving control signal within the measurement interval for a frequency spectrum characteristic of an undamaged engraving stylus; and generates a control signal signaling identified damage to the engraving stylus given deviation of the frequency spectra.

19. An engraving machine for engraving printing cylinders, comprising:

a rotatably seated printing cylinder and an engraving element having an engraving stylus controlled by an engraving control signal that engraves a sequence of cups arranged in an engraving raster into the rotating printing cylinder engraving line by engraving line, whereby the engraving element is axially displaceable along the rotating printing cylinder for planar engraving; and an engraving stylus monitoring device for continuously checking of functionability of the engraving stylus and which receives the engraving control signal of test cups engraved simultaneously with the printing form, respectively defining for selected test cups the engraving stylus monitoring device a measurement interval within the period of the raster signal allocated to the selected cups, the raster signal respectively eliminating the raster signal from the engraving control signal for a duration of the measurement interval, investigating the remaining engraving control signal for harmonics characteristic of an undamaged engraving stylus within the respective measurement interval by a digital filtering, comparing the frequency spectrum of the harmonics determined with the digital filtering to a frequency spectrum characteristic of an undamaged engraving stylus, and generating a control signal signaling identified damage to the engraving stylus given deviation of the frequency spectrum.

20. The machine according to claim 19 wherein the damage comprises breakage of the engraving stylus.

21. An engraving machine for engraving printing cylinders, comprising:

a rotatably seated printing cylinder and an engraving element having an engraving stylus controlled by an engraving control signal that engraves a sequence of cups arranged in an engraving raster into the rotating printing cylinder engraving line by engraving line, whereby the engraving element is axially displaceable along the rotating printing cylinder for planar engraving; and an engraving stylus monitoring device for checking of functionability of the engraving stylus and which receives the engraving control signal of test cups engraved with the printing form, respectively defining for selected test cups the engraving stylus monitoring device a measurement interval, the raster signal respectively eliminating the raster signal from the engraving control signal for a duration of the measurement interval, investigating the remaining engraving control signal for harmonics characteristic of an undamaged engraving stylus within the respective measurement interval, comparing the frequency spectrum of the harmonics to a frequency spectrum characteristic of an undamaged engraving stylus, and generating a control signal signaling identified damage to the engraving stylus given deviation of the frequency spectrum.

* * * * *